United States Patent
Kodim et al.

(10) Patent No.: US 6,281,844 B1
(45) Date of Patent: Aug. 28, 2001

(54) ELECTRICAL COMPONENT AND AN ELECTRICAL CIRCUIT MODULE HAVING CONNECTED GROUND PLANES

(75) Inventors: Walter Kodim, Nürnberg; Frank Bäuerlein, Winkelhaid, both of (DE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 09/433,794

(22) Filed: Nov. 3, 1999

(30) Foreign Application Priority Data

Nov. 4, 1998 (EP) .................................................. 98120664

(51) Int. Cl.[7] .................................................. H01Q 1/38
(52) U.S. Cl. .................... 343/700 MS; 343/846; 343/878; 343/906
(58) Field of Search .................... 343/700 MS, 846, 343/848, 849, 909, 906, 911 R, 878, 897; 361/742, 747

(56) References Cited

U.S. PATENT DOCUMENTS

| | | | |
|---|---|---|---|
| 4,450,449 | * | 5/1984 | Jewitt .................................................. 343/846 |
| 4,912,481 | * | 3/1990 | Mace et al. ........................... 343/846 |
| 4,937,585 | * | 6/1990 | Shoemaker .................... 343/700 MS |
| 5,210,541 | * | 5/1993 | Hall et al. ...................... 343/700 MS |
| 5,248,947 | * | 9/1993 | Shiga .............................. 343/700 MS |
| 5,410,449 | | 4/1995 | Brunner ................................. 361/719 |
| 5,448,250 | * | 9/1995 | Day ................................. 343/700 MS |
| 5,517,162 | | 5/1996 | Ariyoshi .............................. 333/222 |
| 5,517,612 | | 5/1996 | Dwin et al. ........................... 395/166 |
| 5,559,521 | * | 9/1996 | Evans et al. ........................... 343/846 |
| 5,635,942 | | 6/1997 | Kushihi et al. ............... 343/700 MS |
| 5,773,898 | | 6/1998 | Kobayashi ........................... 257/783 |

FOREIGN PATENT DOCUMENTS

| | | |
|---|---|---|
| 19520700A1 | 12/1995 | (DE) . |
| 0588465A1 | 3/1994 | (EP) . |
| 07183330 | 7/1995 | (JP) . |
| 10093474 | 4/1998 | (JP) . |

OTHER PUBLICATIONS

MA–COM, An AMP Company, "On Board Micro GPS Patch Antennas" pp. 31–32.
Robert A. Sainati, "CAD of micro–strip antennas for wireless Applications", Artech House, Inc. 1996, pp. 1–5, 18–19 and 50.
Date of Completion: Feb. 7, 2000; Date of Mailing: Feb. 16, 2000.

* cited by examiner

*Primary Examiner*—Don Wong
*Assistant Examiner*—Thuy Vinh Tran
(74) *Attorney, Agent, or Firm*—Burns, Doane, Swecker & Mathis, L.L.P.

(57) ABSTRACT

The invention relates to an electrical component (CO) as well as a device (DEV) comprising such an electrical component (CO) and an electric circuit module (MO). A ground plane (4) of the component (CO) and a ground plane (2) of the circuit module (MO) are brought into contact via projections (4") provided on the ground plane (4) of the component (CO) and/or on the ground plane of the circuit module (MO). The provision of the projections (4") and the recesses (4') therebetween provide heat sinks between the projections (4") when they are soldered to the ground plane (2) of the circuit module (MO). Through-holes (8') and additional non-ground conductors (2') can be provided between pads (14) of the ground plane (2) of the circuit module (MO) allowing an efficient use of the available space. The invention is particularly useful when a patch antenna needing a large ground plane is connected to a multilayer circuit board. Another embodiment of the invention comprises a plurality of spacer elements which are arranged between the ground planes (2, 4) of the circuit module (MO) and of the component (CO), such that the ground planes (2, 4) can be kept flat. This allows a design of the configuration of the ground plane of the circuit module (MO) independently from a configuration of the component (CO).

38 Claims, 10 Drawing Sheets

PROJECTIONS:
VARIANTS

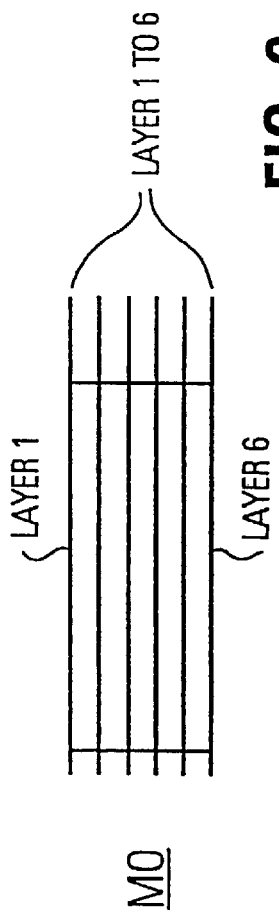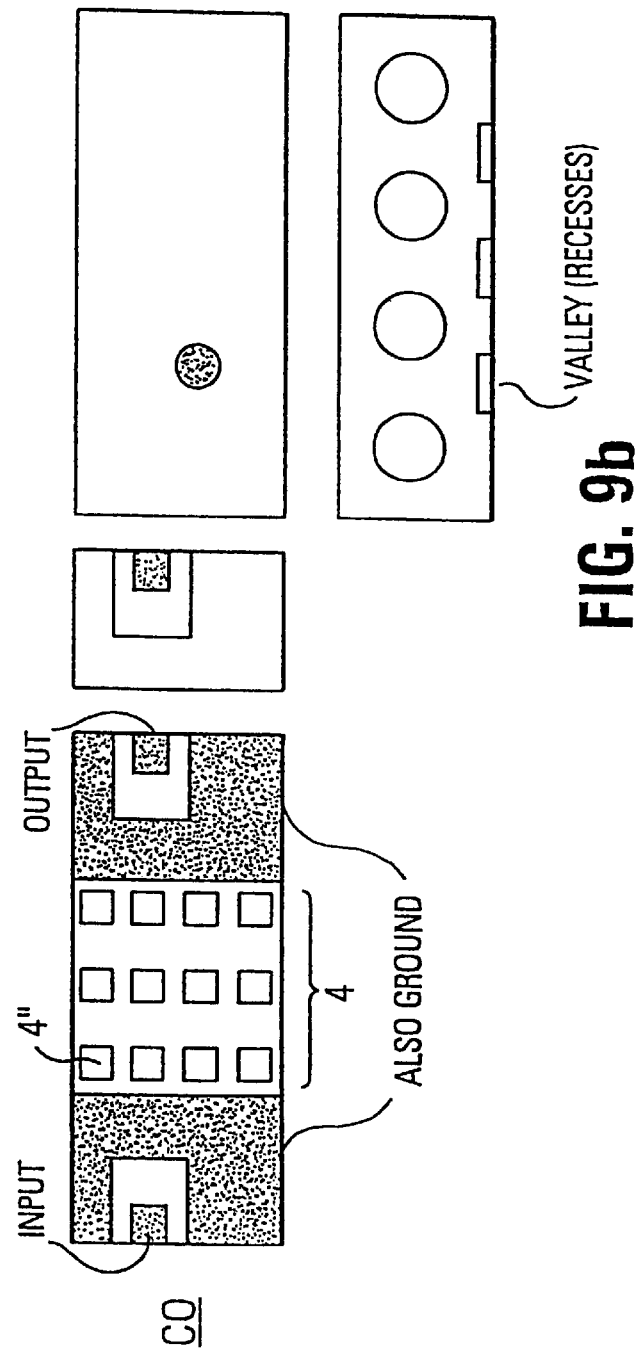
FIG. 9a
FIG. 9b

US 6,281,844 B1

ELECTRICAL COMPONENT AND AN ELECTRICAL CIRCUIT MODULE HAVING CONNECTED GROUND PLANES

FIELD OF THE INVENTION

The invention generally relates to situations, where the ground plane of an electrical component and the ground plane of an electrical circuit module, which form an electrical device, are to be connected. In particular, the invention relates to the problem, how the ground plane of an electrical component, e.g. a microstrip patch antenna, a filter, or a power amplifier, can be connected to a grounding plane of a circuit board, e.g. a printed circuit board or a multilayer circuit board. More specifically, the invention addresses the problem, how the grounding planes can be connected, while an extremely efficient utilization of the board area as well as good mounting properties, e.g. a good reflow solderbility with little remaining stresses, can be achieved.

U.S. Pat. No. 5,517,612 describes that a dielectric resonator block can be connected to a mounting substrate using solder bumps.

Here, the input and output electrodes are to be connected to conductor patterns on the mounting substrate. Patent Abstracts of Japan, Volume 95, No. 10, Nov. 8, 1995 and JP 07 183 330 A relate to a method for connecting semiconductor devices to a wiring board. Here, grounding electrode pads are formed on the entire surface of the semiconductor device containing circuit pattern regions other than the electrode pads for signal transmission lines.

DE 195 20 700 A1 shows that a chip contact area is exposed from an epoxy housing and is connected to a conductor structure via a plurality of solder contact bumps.

U.S. Pat. No. 5,635,942 relates to a microstrip antenna where the grounding plane is soldered to a circuit pattern which is provided on the printed circuit board.

EP 0 588 465 11 relates to a ceramic dielectric for antennas. A configuration is shown which is very similar to what will be described as prior art in FIG. 3 of the present application.

U.S. Pat. No. 5,410,449 discloses the usage of a solder layer and platforms in order to connect the heat sink to the substrate. On the surface of the substrate a conductor pad forms an electrically conductive path.

Patent Abstracts of Japan, Vol. 98, No. 9, Jul. 31, 1988 and JP 10 093 474 A relate to an antenna multicoupler. A plurality of bumps are provided at the rear side of a multilayer substrate of an antenna multilayer to maintain a fixed interval from a grounded surface of a mounted substrate.

Although the invention considers any device comprising an electrical component and an electrical circuit module interconnected at their ground planes, the invention particularly relates to the interconnection of such units in GPS (GPS=Global Positioning System) modules and/or mobile telephones with such GPS functionalities. For example, if a microstrip patch antenna is used as part of a GPS (Global Positioning System) receiver incorporated in a mobile telephone, space constraints are very severe and any available space on the circuit board of the mobile telephone should be used as efficiently as possible.

BACKGROUND OF THE INVENTION

FIG. 1 shows a device DEV comprising an electrical circuit module MO and at least one electrical component CO. The electrical circuit module MO comprises a base 1 and a metallized ground plane 2 which is for example made of aluminium or copper. The electrical component CO also comprises a base 3 and a metallized ground plane 4. The two ground planes 2, 4 are to be brought into contact with each other, as indicated with the arrow in FIG. 1. If for example the electrical component is a patch antenna, the ground plane 2 should normally have a size 3-times of the size of the ground plane 4 of the electrical component CO to achieve an effective grounding. The portion 5 can comprise other circuit components 6 which are interconnected via a conductor pattern 7.

It should be noted that the electrical component CO can in principle be any component which requires the connection to a ground plane as for example provided by the electrical circuit module MO. Such grounding problems often occur in high frequency circuits, for example when the electrical circuit module is a high frequency circuit. An example for the electrical component CO is a micro-strip patch antenna, in particular a ceramic patch antenna.

FIG. 3 shows the principle structure of such a ceramic patch antenna as generally known in the art and described in "CAD of micro-strip antennas for wireless applications" by Robert A. Sainati, Artech House, INC., 1996, ISBN 0-89006-562-4, pages 1–5, 18, 19 and 50, 51. FIG. 3a shows a cross sectional view of such a ceramic patch antenna, FIG. 3b is a bottom view and FIG. 3c is a perspective view. Ordinary patch antennas consist of rectangular or round slices of a ceramic material 3 with a preferably high dielectric constant $\in_r$. Furthermore, a conducting layer pattern 11 is provided on the upper surface and a ground plane 4 is provided on the lower surface. Typically, the conducting layer pattern 11 is rectangluar or squared in shape or consists of a pattern of single stripes depending on the desired radiation pattern.

In order to feed energy to the conducting layer 11, the ground plane 4 has an opening 13 through which a feeding pin 12 extends. The feeding pin 12 can be soldered to the conducting layer pattern 11. Therefore, when the component CO is constituted by such a ceramic patch antenna as is shown in FIG. 3, when mounting the component CO to the electrical circuit module MO, also the circuit module MO (cf. FIG. 1), i.e. the circuit board, has a corresponding opening in its ground plane 2 in order to avoid a short circuit. Energy is then fed to the feeding pin from a lower layer of the multilayer board MO.

In a mobile telephone such a ceramic patch antenna is for example used as part of a GPS receiver. Therefore, when mounting such a component CO onto the electrical circuit module MO, the available space must be used as efficiently as possible and furthermore, from a manufacturing point of view, an easy mounting technique should be used. Generally, the antenna characteristic is mainly determined by the mechanical dimensions of the conducting layer 11 and the substrate 3 as well as the substrate properties.

Regarding the efficient use of the available space, substrates 3 with a high dielectric constant $\in_r$ lead to reductions in size, because the effective wavelength $\lambda_e$ diminishes according to the equation $\lambda_e = \lambda_0/\sqrt{\in_r}$ ($\lambda_0$=free space wavelength, $\sqrt{\in_r}$=shortage factor). Thus, with increasing dielectric constant $\in_r$, the effective wavelength $\lambda_e$ decreases. For decreasing values of $\lambda_e$, the area of the conducting layer 11 can in general be reduced. On the other hand, for a proper operation, a ceramic patch antenna requires a ground plane 2 in the module 110 which should be around 3-times larger than the ceramic substrate 3.

As shown in FIG. 2, typically the circuit module MO is constituted by a multilayer board (here a 6 layer board)

where conductor patterns $5_1$, $5_2$, $5_3$ may be provided on several levels, possibly with intermediate insulation layers $10_1$, $10_2$. In such multilayer board configurations, generally through-holes 8 as well as blind-holes $9_1$, $9_2$ are used. The through-holes 8 may connect all conductor patterns of all levels by means of a metallization which is applied to the inside walls of the hole 8. On the other hand, blind holes 9 only connect two or more layers without extending through all layers. It is clear from FIG. 2 that in the conventional configuration, there is no possibility to use the large area (called the restricted area in FIG. 2) directly underneath the ceramic patch antenna for through-holes or routing purposes for signals not having a ground potential, since all signals would invariably be short-circuited to the ground plane 4 of the electrical component CO, if the through-hole would be placed in the restricted area (the inside metallization in the hole 8 would directly merge into the ground plane pattern. That is, no conductor pattern can be used for the routing of other signals of non-ground potential. This leads to an increase in size of the device, since the through-holes must be placed at other parts of the circuit module. It should be noted that FIG. 2 shows the device before all layers are fitted together, i.e. the spaces indicated with ※ in FIG. 2 are spaces which collapse once all layers are fitted together under high pressure/high tension.

Furthermore, two techniques have been used up to now in order to mount the component CO to the circuit module MO such that a good contact between the two ground planes 4, 2 is maintained even in the presence of vibrations or shocks. One conventionally used method is to provide an adhesive material on one of the ground planes 4, 2 and to then stick the two parts together. However, the adhesive material must be conductive and may reduce the optimal contacting of the two ground planes 4, 2 by introducing additional resistances. Furthermore, the adhesive may deteriorate over time and thus the adhesion/cohesion strength may also decrease. For example, when a patch antenna is used as part of a GPS receiver, even small deviations or deteriorations may lead to a reduced strength of the received signal and hence to a degradation in the position estimation performance.

Therefore, another conventionally used method is reflow soldering where a soldering paste is applied to one ground plane or to both ground planes 2, 4. The component CO is e.g. placed on the ground plane of the circuit module MO and hot air or an infrared radiation is applied to solder the component CO onto the circuit module MO. However, it is quite difficult to reflow solder such ceramic patch antennas, because major parts of the area that needs to be soldered are covered by the component. Vaporized solder fluid as a result of the application of the hot air or the infrared radiation can not escape from the area underneath the component and can lead to bubbles (i.e. small cavities) between the ground plane 2 and the ground plane 4. This can drastically reduce the electrical conducting properties.

Furthermore, if portions or even the complete area of the grounding plane 4 is soldered, such large area solder joints can lead to tensions between the component CO and the circuit module MO, since most likely the component CO and the circuit module MO have different temperature coefficients (e.g. the ceramic substrate 3 and the substrate 1 of the component CO and the circuit module MO will most certainly have different temperature coefficients). This can result in an undesired bending and in twisting of the board and may also reduce the conducting properties since due to the deformations some parts of the two ground planes 2, 4 may not be in contact with each other. Furthermore, the deformations caused by the application of the comparatively high temperature during the soldering process may cause a breakage of the connection between portions of the ground planes 2, 4 or the breakage of internal connections in the circuit module, i.e. the multilayer board, over time.

The U.S. Pat. No. 5,517,162 describes a dielectric resonator device including a dielectric member having an outer surface, a plurality of inner conductors provided in the dielectric member, an outer conductor disposed on the outer surface of said dielectric member and having a mounting surface, signal input and output electrodes disposed on the outer surface of said dielectric member to oppose a mounting substrate and electrically coupled with said inner conductors and a plurality of solder bumps disposed on both the mounting surface of the outer conductor and on said signal input and output electrodes. The plurality of solder bumps are located so as to mechanically and electrically connect said outer conductor and said signal input and output electrodes to the mounting substrate when the solders are melted. This prior document only discloses a pattern of solder bumps for two different pontentials such that during the melting process a connection of the electrodes is avoided.

The patent abstracts of Japan, vol. 98, no. 9, Jul. 31, 1998 & JP 10 093474 A discloses an antenna multicoupler. To maintain a grounded potential of high frequency band in a wide range and to obtain high performance characteristics a solder bump is formed at the rear side of a multilayer substrate of an antenna multilayer to maintain a fixed interval from a grounded surface of a mounted substrate.

In both afore-mentioned documents it is only disclosed that solder bumps according to a predetermined arrangement pattern are provided and the solder bumps melt during the soldering process. Thus, such kind of solder bumps cannot be regarded as the spacer elements of the connecting means according to the present invention as will be explained below.

U.S. Pat. No. 5,635,942 describes a special patch antenna and shows in FIG. 3 a device including an electrical component and an electrical circuit module both having flat ground plains.

The European patent application EP 0 588 465 A1 describes a microstrip antenna and shows in FIG. 1 a similar construction as explained with reference to FIG. 3 in the present application. That is, an electrical component and an electrical circuit module both have flat ground plains.

OBJECTS OF THE INVENTION

As explained above, when mounting a component to a circuit module such that their ground planes are in contact with each other, an efficient use of the available space is desired whilst a secure attachment of the component to the circuit module should be ensured.

Therefore, a first object of the invention is to provide an electrical component and a device comprising such an electrical component and an electrical circuit module, which allow an efficient use of the available space.

Furthermore, a second object of the invention is to provide an electrical component and a device comprising such an electrical component and an electrical circuit module, where a secure attachment of the component to the circuit module is ensured without causing unwanted tensions and deformations in the component and the circuit module.

SOLUTION OF THE INVENTION

According to a first aspect of the invention (claim 1), the above objects are solved by an electrical component having a ground plane adapted to be connected to a ground plane of an electrical circuit module, wherein said ground plane of said electrical component comprises a plurality of projections arranged according to a predetermined arrangement pattern.

Furthermore, according to a variant (claim 8) of the first aspect of the invention, the above objects are solved by a device, comprising an electrical circuit module and at least one electrical component connected to ground planes thereof, wherein said ground plane(s) of said electrical component(s) and/or parts of said ground plane of said electrical circuit module comprises a plurality of projections arranged according to a predetermined arrangement pattern, wherein said ground planes are contacted via said projections.

According to a second aspect of the invention (claim 23), the above objects are also solved by a connecting means for connecting the ground planes of an electrical circuit module and at least one electrical component, wherein the connecting means comprises a plurality of spacer elements connected with both the ground plane of one of said electrical components and the ground plane of said electrical circuit module, wherein said spacer elements are arranged according to a predetermined arrangement pattern.

According to a variant of the second aspect (claim 31) of the invention, the above objects are also solved by a device comprising an electrical circuit module and at least one electrical component having ground planes in conductive contact with each other, wherein between said ground plane of said electrical component and said ground plane of said electrical circuit module a connecting means is provided, wherein said connecting means comprises a plurality of spacer elements connected with both the ground plane of said electrical component and the ground plane of said electrical circuit module, wherein the spacer elements are arranged according to a predetermined arrangement pattern.

ADVANTAGES OF THE INVENTION

Since in the above first aspect the ground plane of the component and/or the ground plane of the circuit module are provided with the projections, the respective ground planes are still completely metallized, however, through-holes can be placed between the individual projections such that an efficient use of the available space is made. Since the ground planes are only contacted at the individual projections, heat sinks are provided between the projections, which allows to reduce the deformation and tensions. The same effect is achieved by the spacer elements of a separately provided connecting means between the ground planes according the second aspect. The spacer elements serve the same function as the projections, since the sapcer elements will also allow to reduce the tensions and to achieve a more efficient use of the available space.

PREFERRED ASPECTS OF THE INVENTION

The usage of projections and spacer elements is particularly advantageous if the electrical component is a patch antenna, in particular a ceramic patch antenna in order to reduce the necessary mounting area in a mobile telephone, for example for use as part of a GPS receiver. However, the electrical component can also be a filter, a power amplifier or any other electrical component that requires grounding of signals by an area of a certain size.

The contacting of the ground planes via the projections can be made by applying an adhesive material or a solder to the projections.

In order to avoid undesired resonance phenomena, the projections and the spacer elements can be arranged in an irregular grid pattern. If they are arranged in a regular grid pattern, then the distance between the individual projections or spacer elements should not be multiples of the free space wavelength or the effective wavelength.

Advantageously, the circuit module is a multilayer circuit board which comprises a plurality of through-holes and/or blind-holes connecting individual layers of the multilayer circuit board. According to the invention, these through-holes and/or blind-holes can be placed at positions between the projections, such that an efficient use of the available area is made.

Advantageously, the connecting means can comprise a conducting or non-conducting layer on which said spacer elements are provided. At least areas of said layer where said spacer elements are attached can be conducting.

Furthermore, the spacer elements may be connected by conducting or non-conducting connection elements. Preferably, the connection elements are conducting and do not touch the surface of the circuit board.

Further advantageous embodiment and improvements of the invention can be taken from the other dependent claims. Hereinafter, the invention will be explained with reference to its advantageous embodiments and with reference to the attached drawings. However, it should be noted that the invention also comprises embodiments constituted by features which have been separately described and claimed in the description and the claims. Therefore, the following description of what is currently considered to be the best mode of the invention should not be limited to the described embodiments.

BRIEF DESCRIPTION OF THE DRAWINGS

FIG. 9*a* shows the structure of a typical multilayer board;

FIG. 9*b* shows a schematic diagram of a microwave band pass filter constituting the electrical component;

Hereinafter, embodiments of the invention will be described. Although the following description takes as an example an electrical component CO constituted by a patch antenna, it should be understood that the inventive mounting of an electrical component CO to a circuit module MO is not restricted to patch antennas. Thus, the invention relates to any situation where two ground planes of two modules or components need to be brought into a secured contact with each other.

Figure 1:
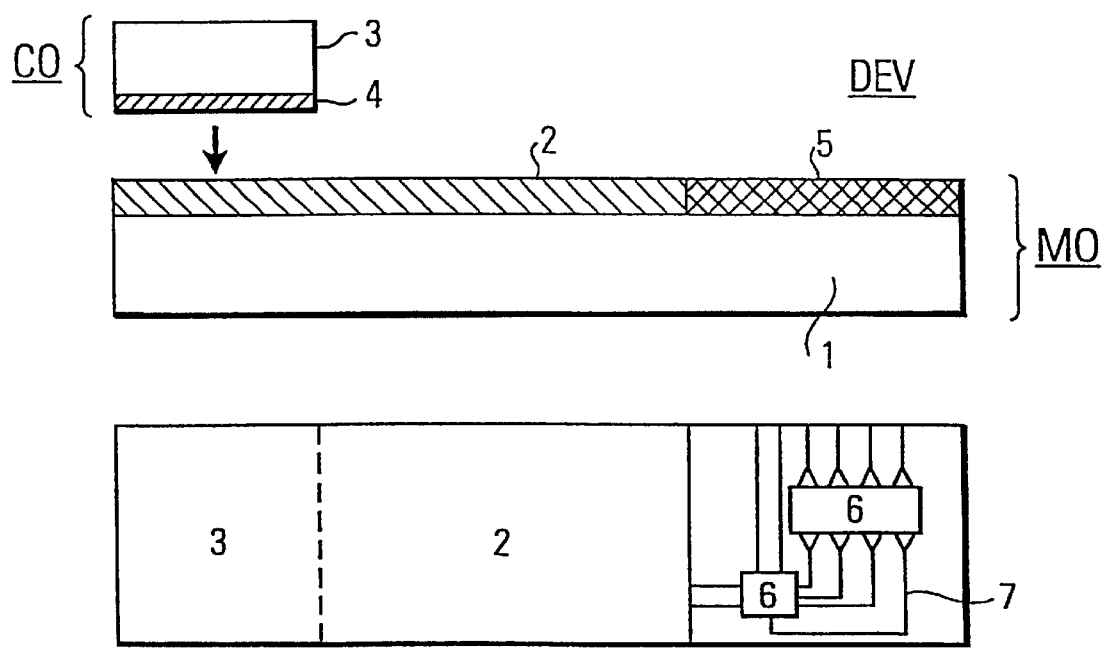
FIG. 1 shows a cross sectional and a top view of a device DEV comprising an electrical component CO and a circuit module MO, according to the prior art.
Figure 2:
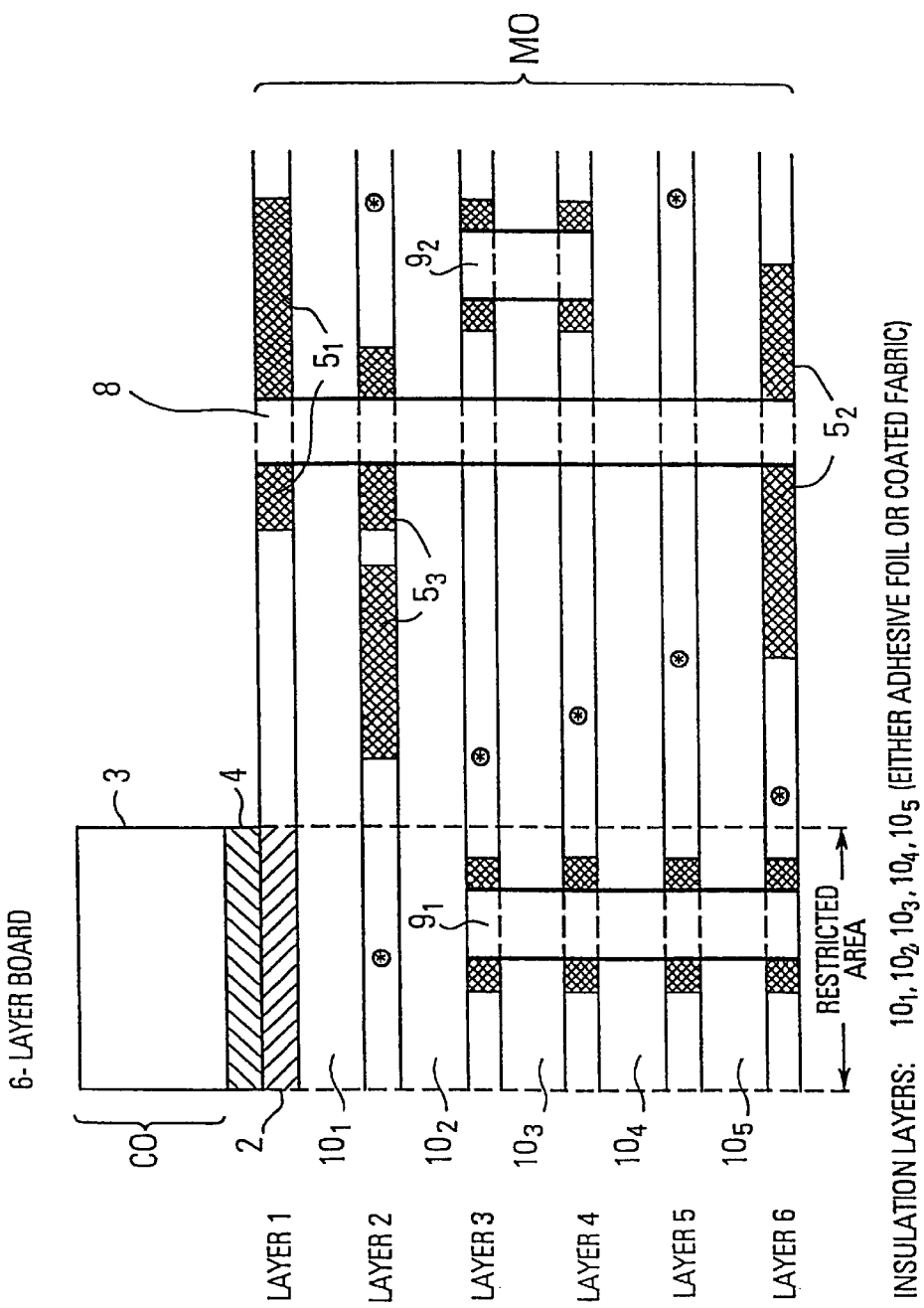
FIG. 2 shows a circuit module MO constituted by a multilayer board together with through-holes 8 and blind-holes 9, according to the prior art.
Figure 3A:
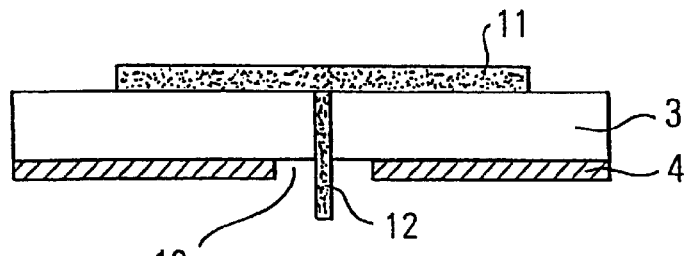
FIGS. 3*a–c* show a cross sectional view, a bottom view and a perspective view, respectively, of a ceramic patch antenna according to the prior art.
Figure 3B:
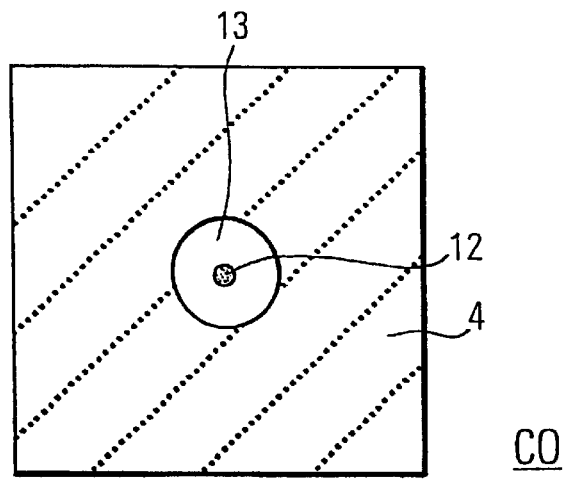
Figure 3C:
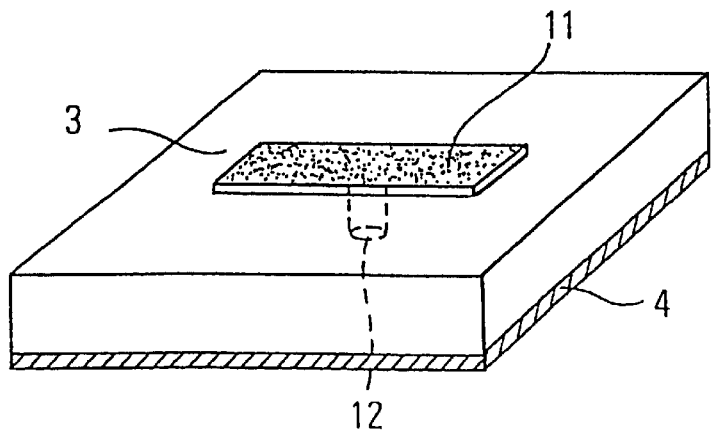
Figure 4A:
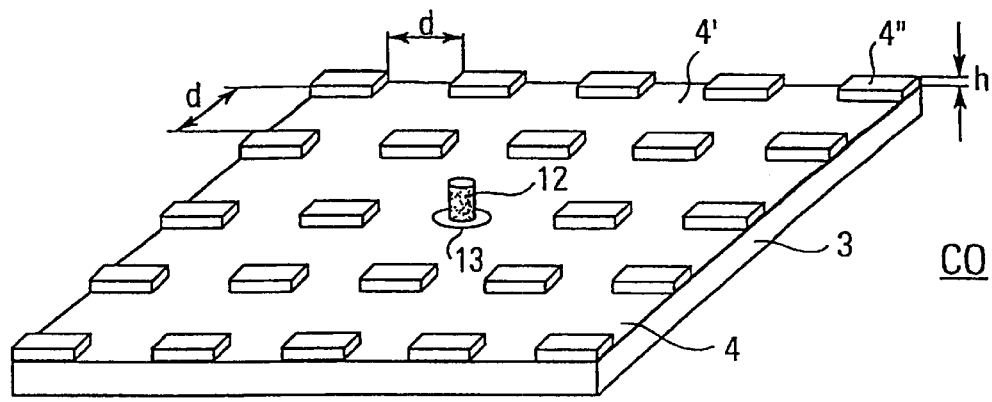
FIG. 4*a* shows a first embodiment of the electrical component according to the invention.

FIG. 4a shows an embodiment of an electrical component CO according to the invention. As an example, a patch antenna is shown as the electrical component CO similarly as in FIG. 3. In FIG. 4a the ground plane 4 according to an emembodiment of the invention comprises a plurality of rectangular projections or pads 4" which are arranged according to a predetermined arrangement pattern. In FIG. 4a a regular grid pattern is chosen for the arrangement of the rectangular projections 4". The provision of the rectangular projections 4" results in the formation of small valleys or recesses 4' between the projections 4". The projections 4" having a structure like a waffle iron as shown in FIG. 4a may be covered with an adhesive or a solder to be brought into contact with the ground plane 2 of the circuit module MO shown in FIG. 1, i.e. the top layer of the circuit module MO preferably having an arrangement of corresponding pads 14 as will be described below with more details regarding FIG. 7.

Figure 5:
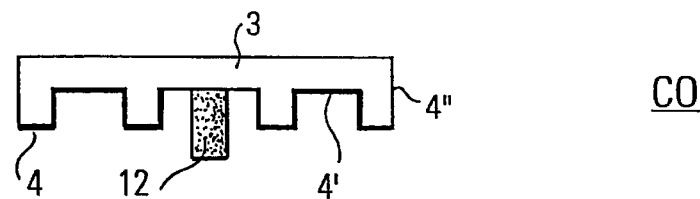
FIG. 5 shows a cross sectional view of the electrical component shown in FIG. 4*a;*

As can be seen in the cross sectional view of the component CO in FIG. 5, the ground plane 4 is still completely metallized over the complete area, however electrical connections between the antenna ground plane 4 and the ground plane 2 of the circuit module MO where the antenna is mounted on are made at specific locations only, namely only where the projections 4" are provided. As mentioned above, the ground plane 2 of the circuit module MO has a number of pads 14 whose arrangment pattern corresponds to the one of the projections 4" of the circuit module MO (cf. FIG. 7). In case of the patch antenna, of course the projections 4" will not be provided at a location where the feeding pin 12 and the necessary hole 13 are formed. However, this depends on the type of electrical component used and in other components, where such a feeding pin 12 is not necessary, of course the complete ground plane can be covered with an array of projections or pads 4" according to any desired pattern.

Figure 4B:
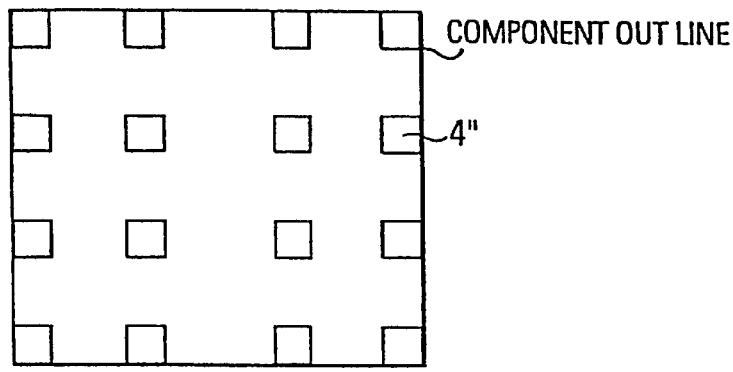
FIGS. 4*b–e* respectively show a plane view of the electrical component CO having rectangular projections shown in FIG. 4*a* and planes views of electrical components CO having round and oval shaped projections.
Figure 4C:
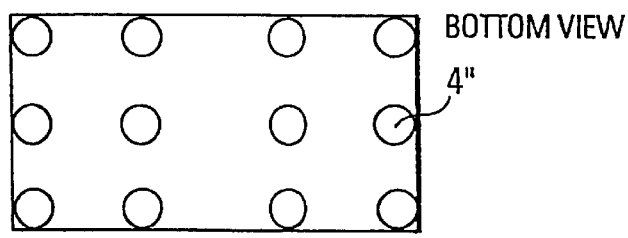
Figure 4D:
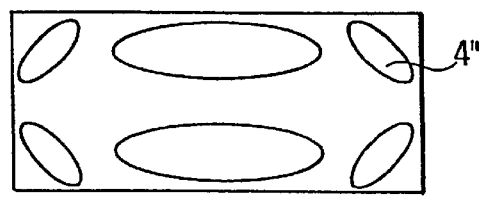
Figure 4E:
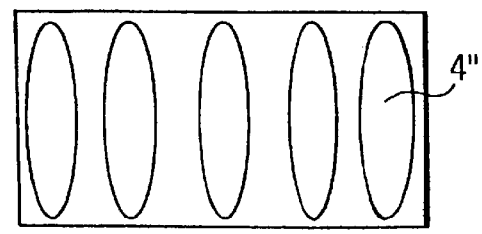

FIG. 4b shows a plane view of the electrical component CO of FIG. 4a, in particular the rectangular projections arranged in the regular grid pattern. FIG. 4c shows the regular grid pattern of a plurality of round shaped projections 4" as another embodiment of the invention; FIG. 4d shows a plurality of elongate oval shaped projections 4", which can also have different forms and sizes to each other and which are arranged in a predetermined regular pattern as yet another embodiment of the invention; and FIG. 4e shows a plurality of elongate oval shaped projections 4" arranged in another predetermined regular pattern (side by side) as yet another embodiment of the invention. Thus, depending on the requirements of the location of the holes and the routing of other conductors in the top layer of the circuit module MO regular and/or irregular patterns can be used. The size and shape of the projections 4" may all be the same or may be different to each other.

Figure 4F:
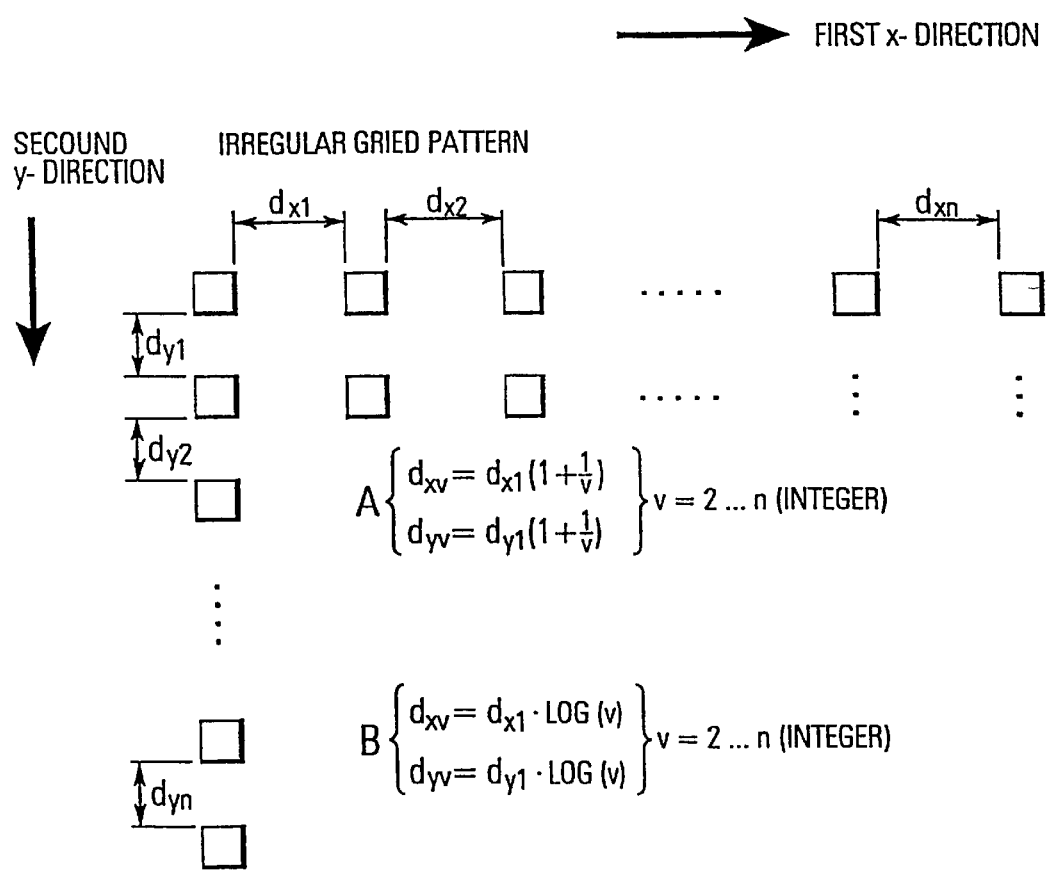
FIG. 4*f* shows an irregular grid pattern of projections 4"

If a regular grid pattern is choosen for the arrangement of the projections 4", it is desired that the spacing d between individual projections 4" is not a multiple of the effective wavelength $\lambda_e$ or the free space wavelength $\lambda_0$, in order to avoid any resonance phenomena. Irregular geometries can be used for the arrangement pattern in particular in order to avoid discrete spurious responses also due to resonance phenomena. FIG. 4f shows an example of an irregular grid pattern. FIG. 4f gives equations for the distances $dx_v$, $dy_v$ for two different cases A, B. $dx_1$ and $dy_1$ are respectively a reference or basic distance in the x- and y-direction and v is the integer number denoting the v-th projection in the x- and y-direction, respectively. Thus, in case A the distances decrease linearly and in case B they logarithmically increase with increasing projection number.

Figure 6:
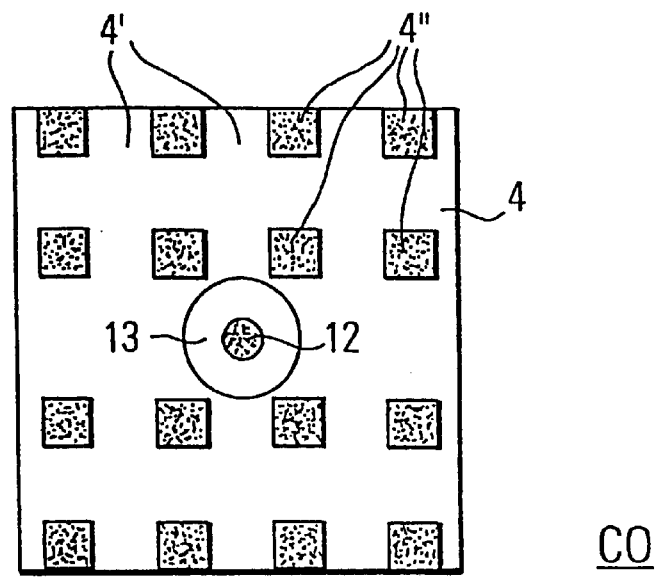
FIG. 6 shows a bottom view of the electrical component shown in FIG. 4*a;*
Figure 7:
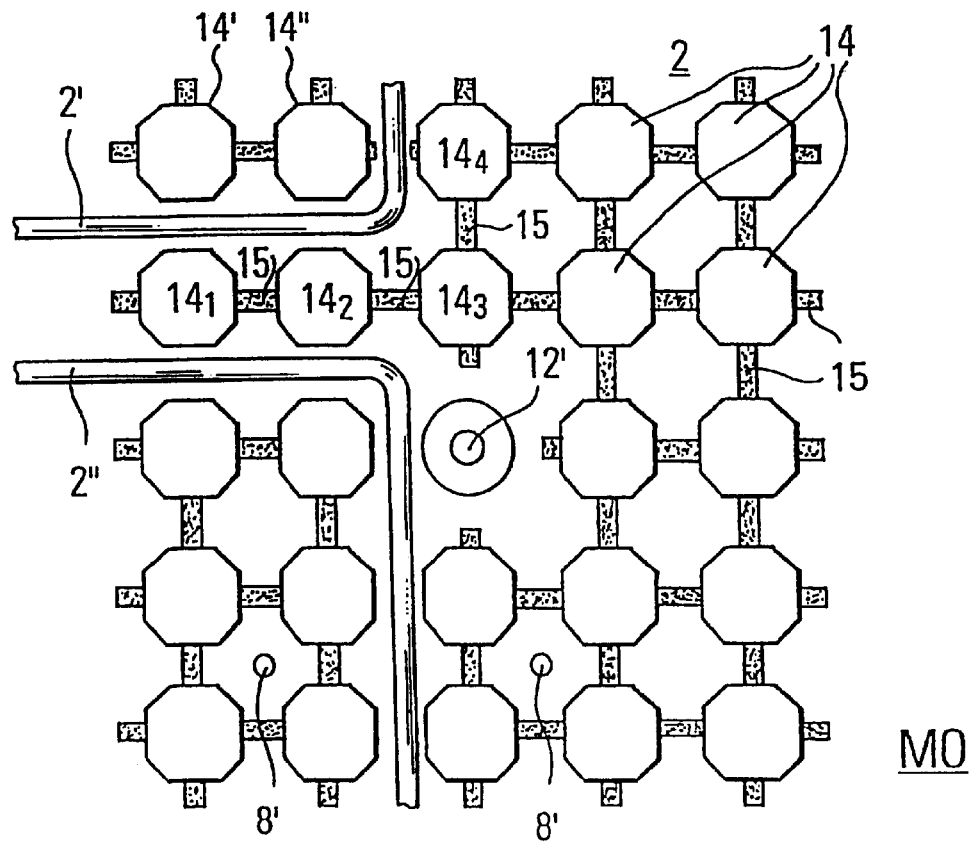
FIG. 7 shows a top view of the circuit module MO according to the invention, in particular a pad pattern provided on the ground plane of the circuit module.

FIG. 6 shows a bottom view of the component CO including the ground plane comprising the projections 4" and the recesses 4' as already shown in the cross sectional view of FIG. 5. In this connection, FIG. 7 shows a top view onto the ground plane 2 of the circuit module MO. Since, as shown in FIG. 6, the ground planes 2, 4 will only be in contact with each other at the projections 4", it is sufficient if the ground plane of the circuit module MO is constituted by the number of pads 14. These pads 14 may be connected either by conductor stripes 15 on the ground plane 2 itself or with the help of blind-holes and conductor stripes on lower layers of the multilayer board. However, since the pads 14 are anyway connected to each other via the contact with the ground plane of the component CO, it should be noted that the stripes 15 are only optional and need not necessarily be provided.

It is possible to provide an adhesive material or a solder paste either on the projections 4" or the pads 14 or on both the projections 4" and the pads 14. In particular, when reflow soldering is performed when the projections 4" are brought into contact with the pad 14, heat sinks provided between the pads 14 avoid the unwanted deformations and unwanted tensions caused by the different temperature coefficients of the component CO and the circuit module MO.

Since the ground plane 2 is only required to have an appropriate foot print comprising the pads 14 (since the conductor stripes are only optional), as shown in FIG. 7, the portions between the pads 14 can now be used for the positioning of through holes 8' and/or blind-holes or even for other conductor tracks 2' guiding signals of different potential. Since the pads 14. are interconnected, e.g. via the contact to the ground plane 4 of the component CO, adjacent conductor tracks 2' and 2" can be shielded from each other, since between these tracks 2 and 2' some pads interconnected through conductor stripes 15, e.g. $14_1$–$14_4$, act as a kind of shielding.

It may be even desired that individual conductor stripes are separated in their potential by the respective ground pads 14 and the connecting elements 15. That is, even though the pads 14', 14" in FIG. 7 are not connected through the connecting conductors 15, they will still be connected to the whole grounding pattern, since they will be connected through the contact via the projections 4" of the component CO. If the component CO is the ceramic patch antenna, between the pads 14 there is also provided a hole 12' for the feeding pin 12 of the patch antenna.

It should be noted above, that it is sufficient if the component CO has a ground plane 4 as shown in FIGS. 4a, 5, 6 and that the ground plane 2 of the circuit module MO does not necessarily have to be provided with the foot print pattern as shown in FIG. 7. For example, the advantages of improving the heat properties may already be obtained by providing the projections 4" only on the component side or only on the circuit module side. The depth of a valley, i.e. the height h of the projections (see FIG. 4a) is determined by the distance needed to secure a sufficient isolation between the ground plane and a conductor track 2' or a through-hole located in the routing areas now provided in the ground plane 2.

Figure 8:
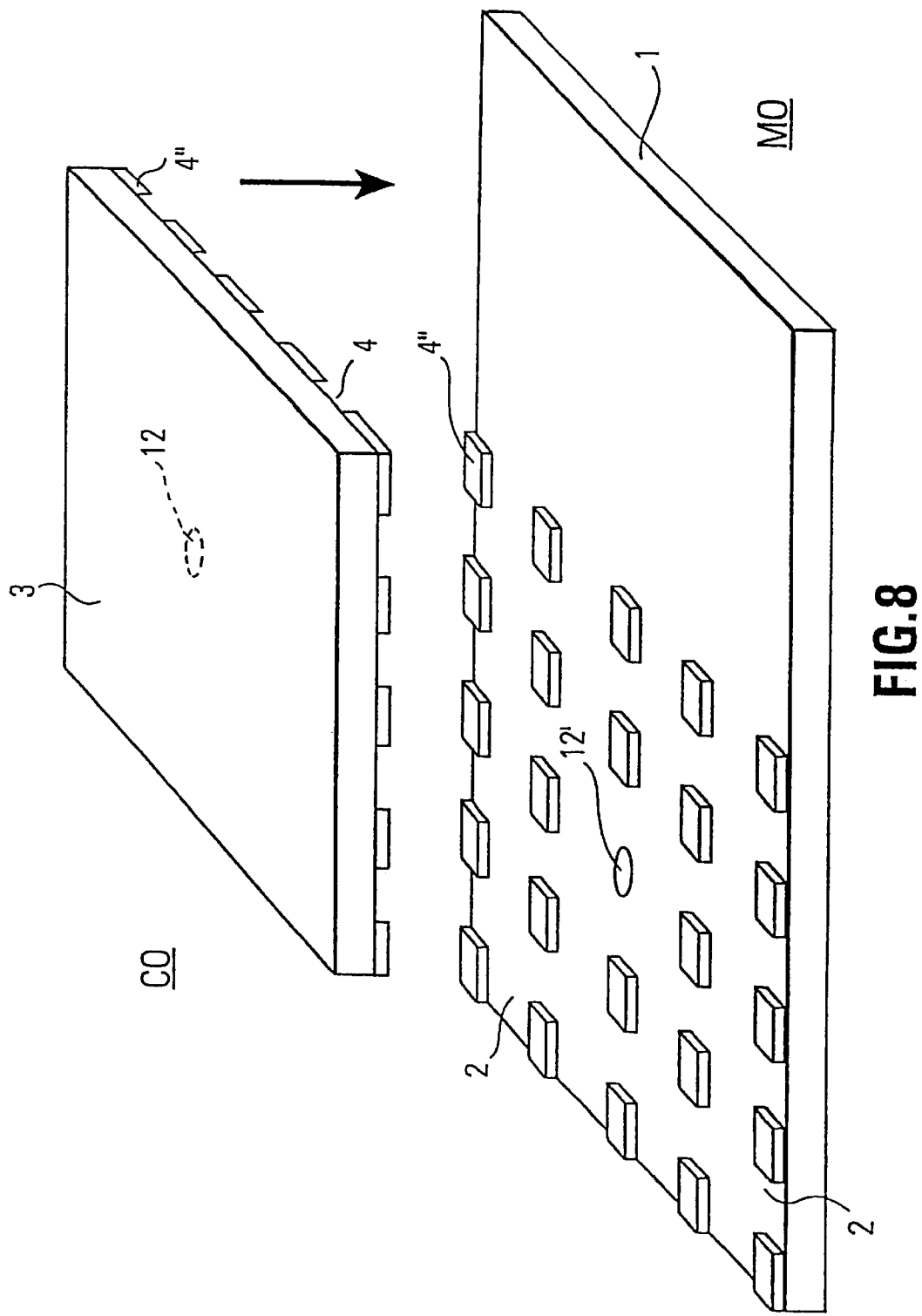
FIG. 8 shows an embodiment of the invention, where the circuit module and the electrical component are both provided with projections.

FIG. 8 shows another embodiment of the invention where the ground plane 4 of the component CO as well as the ground plane 2 of the circuit module MO are both provided with the projections 4". The advantage of such an arrangement is that the location where the highest temperatures are generated, i.e. on the surfaces of the respective projections 4" are at equal distances from both substrates 1, 3, respectively. Thus, a more uniform distribution of the heat can be achieved in addition to the advantages described above.

As shown in FIG. 7, the flexibility in the board layout is considerably improved since through-holes needed for the routing of "non"-ground signals can be located underneath the component CO. This is in particular useful in case of a "standard" 6-layer board as shown in FIG. 9a where the ceramic patch antenna is mounted on layer 1 and other components are mounted on layer 6. Thus, layer 1 and layer 2 can now be connected also by blind-holes located underneath the component, such that the routing flexibility is ensured.

It should be noted that any other component CO can be used, which requires a ground plane (i.e. components requiring a grounding plane instead of a grounding pin), for example filters, such as the ceramic band pass filter as schematically shown in FIG. 9b, or a low pass, high pass or a band reject filter. Between the input and the output of the band pass filter there is provided the grounding area 4 having the projections 4" as already described above. Also here the ground plane consists of a number of valleys (recesses) and projections as generally described above with reference to FIG. 4a.

As described above, the provision of the projections 4" and/or the recesses 4' separate the component ground plane 4 and the circuit module ground plane 2 from each other, such that heat sinks are provided by the recesses 4. The projections and/or recesses may be provided in the component and/or in the circuit module.

Figure 10:
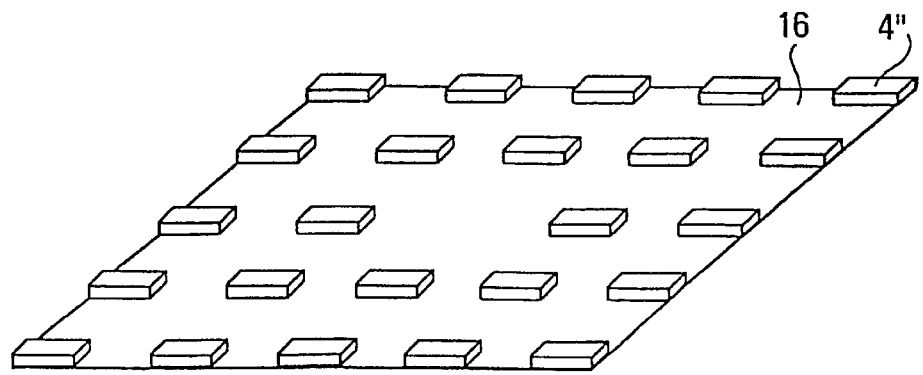
FIG. 10 shows an embodiment of the connecting means, in particular the plurality of spacer elements 4" provided on a thin layer 16.

FIG. 10 shows another embodiment of the invention, showing in particular a connecting means constituted by a number of conducting spacer elements 4". That is, if it is not desired to modify the geometry of the ground plane of the component CO and/or the circuit module MO, the same technical effect can still be achieved by inserting a number of spacer elements 4" between the two ground planes 2, 4. The spacer elements 4" may be provided with an adhesive or a solder paste on both sides to allow their attachment to the two grounding planes 2, 4 at predetermined places. For example, if the component CO has a flat grounding plane, the design flexibility in arranging the pads 14 and the conductor pattern of the ground plane 2 of the circuit module MO and the conductor stripes of other non-ground potential conductors as well as the through-holes and blind-holes can be improved.

For the mounting process, first the spacer elements 4" are removed from the layer 16 and then they are attached to the arranged pads 14 on the upper layer of the circuit module. Thereafter, the component grounding plane is attached to the spacer elements 4". In this case, the layer 16 only serves as a storage carrier.

Another embodiment of the connecting means can also be taken from FIG. 10. That is, the connecting means itself may comprise not only the spacer elements 4" but also the layer 16 on which the spacer elements 4" are mounted. In this case, the layer 16 is conducting at least in those areas where the spacer elements 4" are attached. If the layer 16 is to be attached to a flat component ground plane, the layer 16 can be conducting everywhere. If the layer 16 is to be attached to the circuit module (and thus the grounding plane of the component is contacted via the spacer elements 4"), non-conducting portions must exist in order to allow the arrangement of other conductors or holes on the upper layer of the circuit module. It is also possible to remove some portions between the spacer elements 4" (e.g. depending on the placement of e.g. holes on the upper layer of the circuit module). Thus, although FIG. 10 shows a regular pattern of spacer elements, any irregular pattern is of course possible.

Figure 11:
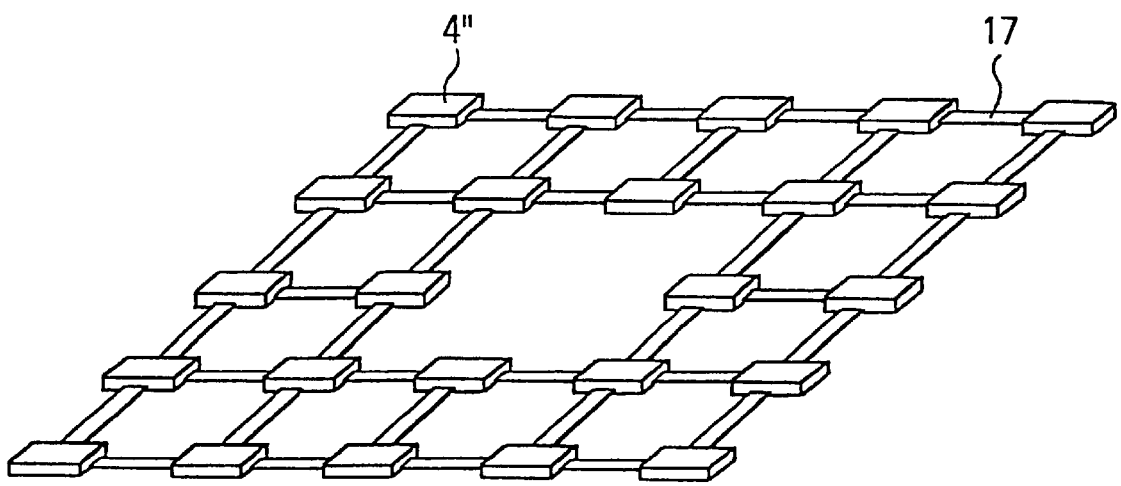
FIG. 11 shows an embodiment of the connecting means constituted by a plurality of spacer elements 4" interconnected via connection elements 17.

Finally, FIG. 11 shows an embodiment of the connecting means also consisting of a plurality of spacer elements 4" which are however interconnected by conducting or non-conducting connecting elements 17. The connecting element 17 may have the same thickness as the spacer elements 4" (height direction) or may be thinner. Such a network of interconnected spacer elements 4" can be cut out from a sheet of conducting material. As explained above, the ground plane 2 of the circuit module MO is provided with a pattern of pads 14 corresponding to the spacer element pattern on the layer 16. In FIG. 11, conductor patterns of non-ground signal lines can be provided between the pads on the upper layer of the multilayer board, either if the connecting elements 17 are non-conducting or if conducting connecting elements 17 are arranged such that they do not touch the upper layer of the circuit module. This is the case, if the conducting connecting elements 17 are either arranged centrally (in the height direction) or if they are aligned with the top surface of the spacer elements 4". This allows great flexibility in the design of the additional conductors and/or holes. Of course, some of the connecting elements 17 may be missing between respective spacer elements 4".

It may be noted that the spacer elements 4" shown in FIGS. 10, 11 are not restricted to the illustrated rectangluar shape and the regular arrangment pattern, i.e. any shape and arrangement pattern can be also be used in FIGS. 10, 11, e.g. as shown in FIGS. 4a–4f.

INDUSTRIAL APPLICABILITY

As explained above, the invention can be used in any situation, where a first module or component having a ground plane needs to be mounted on a second module also having a ground plane, such that the two ground planes form a good electrical contact without causing any deformations while still allowing an efficient use of the available connecting areas. It makes no difference whether the projections are provided on the component or the circuit module or whether even an additional connecting means consisting of a plurality of spacer elements serving the same purpose as the projections are provided.

Therefore, the invention can be applied to any electrical component and any electrical circuit module where such two ground planes may have to be connected. Electrical in this sense only means that some grounding is to be performed. Of course, the invention is particularly advantageous in high frequency circuits, since here an efficient grounding must always be provided, for example when the component is a patch antenna, a filter or a power amplifier.

What has been described above is currently considered to be the best mode of the invention. However, further modifications and variations of the inventions can be provided by the person skilled in the art on the basis of the above teachings. The invention also comprises embodiments of separately described and claimed features.

Furthermore, reference numerals in the claims only serve clarification purposes and do not limit the scope of protection.

What is claimed is:

1. An electrical component (CO) comprising:
    a base (3); and
    a ground plane (4) having a front surface and a back surface, said back surface of the ground plane (4) being connected to a surface of the base (3), and said front surface of said ground plane (4) being adapted to be connected with a ground plane (2) of an electrical circuit module (MO);
    wherein said front surface of said ground plane (4) is provided with a plurality of projections (4") and recesses (4') between the projections (4") arranged according to a predetermined arrangement pattern; and
    wherein said ground plane (4) of said electrical component (CO) is mechanically and electrically connected with the ground plane (2) of the electrical circuit module (MO) only at specific locations of said projections (4").

2. The electrical component (CO) according to claim 1, wherein said electrical component (CO) is a patch antenna (3, 4, 11).

3. The electrical component (CO) according to claim 2, wherein said patch antenna is a ceramic patch antenna including a ceramic substrate (3) having on a first side a conducting layer (11) and on a second side opposite said first side said ground plane (4).

4. The electrical component (CO) according to claim 1, wherein said electrical component (CO) is a filter or a power amplifier.

5. The electrical component (CO) according to claim 1, wherein at the specific locations of the projections (4") a conductive adhesive or solder is provided.

6. The electrical component (CO) according to claim 1, wherein the arrangement pattern of said projections (4") is a regular grid pattern.

7. The electrical component (CO) according to claim 1, wherein the arrangement pattern of said projections (4") is an irregular grid pattern, where distances ($dx_v$, $dy_v$) in a first or second direction of the grid between individual projections (4") are different to each other and increase or decrease in said first or second direction of the grid.

8. A device (DEV) comprising an electrical circuit module (MO) having a ground plane (2) and at least one electrical component (CO) said at least one electrical component (CO) comprising:
    a base (3); and
    a ground plane (4) having a front surface and a back surface, said back surface of the ground plane (4) being connected to a surface of the base (3), and said front surface of said ground plane (4) being adapted to be connected with a ground plane (2) of the electrical circuit module (MO);
    wherein the ground plane (2) of the electrical circuit module (MO) and said ground plane (4) of said electrical component (CO) are mechanically and electrically connected only via the projections (4").

9. The device according to claim 8, wherein said electrical component (CO) is a patch antenna (3, 4, 11).

10. The device according to claim 9, wherein said patch antenna is a ceramic patch antenna including a ceramic substrate (3) having on a first side a conducting layer (11) and on a second side opposite said first side said ground plane (4).

11. The device according to claim 8, wherein said electrical component (CO) is a filter or a power amplifier.

12. The device according to claim 8, wherein said projections (4") are provided on the ground plane (4) of said electrical component (CO), and said ground plane (2) of said electrical circuit module (MO) comprises a conductor pad (14) pattern corresponding to the arrangement pattern of said projections (4") of said ground plane (4) of said electrical component (CO).

13. The device according to claim 8, wherein said electrical circuit module (MO) is a printed circuit board.

14. The device according to claim 8, wherein said projections (4") are provided with solder or a conductive adhesive.

15. The device according to claim 8, wherein the arrangement pattern of said projections (4") is a regular grid pattern.

16. The device according to claim 8, wherein the arrangement pattern of said projections (4") is an irregular grid pattern, where distances ($dx_v$, $dy_v$) in a first or second direction of the grid between individual projections (4") are different to each other and increase or decrease in said first or second direction of the grid.

17. A device (DEV) comprising:
    an electrical circuit module (MO), wherein said electrical circuit module (MO) is a multilayer circuit board; and
    at least one electrical component (CO) connected at ground planes (2; 4) thereof;
    wherein said ground plane (4) of said electrical component (CO) and/or said ground plane (2) of said electrical circuit module (MO) comprises a plurality of projections (4") arranged according to a predetermined arrangement pattern; and
    wherein said ground planes (2; 4) are in electrical contact with each other via said projections (4").

18. The device according to claim 17, wherein said multilayer circuit board comprises a plurality of through-holes (8') and blind-holes provided between said pads (14) and connecting individual layers of said multilayer circuit board.

19. The device according to claim 17, wherein said multilayer circuit board comprises a plurality of signal conductors (2') not having a ground potential and being arranged between said conductor pads (14).

20. A device (DEV) comprising:
    an electrical circuit module (MO); and
    at least one electrical component (CO) connected at ground planes (2; 4) thereof;
    wherein said ground plane (4) of said electrical component (CO) and/or said ground plane (2) of said electrical circuit module (MO) comprises a plurality of projections (4") arranged according to a predetermined arrangement pattern on the ground plane (4) of said electrical component (CO);
    wherein said ground planes (2; 4) are in electrical contact with each other via said projections (4"); and
    said ground plane (2) of said electrical circuit module (MO) comprises a conductor pad (14) pattern corresponding to the arrangement pattern of said projections (4") of said ground plane (4) of said electrical component (CO), said conductor pads (14) being connected through conductor stripes (15).

21. The device according to claim 20, wherein said multilayer circuit board comprises a plurality of through-holes (8') and blind-holes provided between said pads (14) and connecting individual layers of said multilayer circuit board.

22. The device according to claim 20, wherein said multilayer circuit board comprises a plurality of signal conductors (2') not having a ground potential and being arranged between said conductor pads (14).

23. A connecting means for connecting ground planes (2, 4) of an electrical circuit module (MO) and at least one electrical component (CO), wherein said connecting means comprises a plurality of spacer elements (4") connectable with both the ground plane (4) of said electrical component (CO) and the ground plane (2) of said electrical circuit module (MO), said spacer element (4") being arranged according to a predetermined arrangement pattern, and the ground planes (2, 4) are electrically and mechanically connected only at the specific locations of said spacer elements (4").

24. The connecting means according to claim 23, wherein said spacer elements (4") are provided with solder.

25. The connecting means according to claim 23, wherein a layer (16) is provided on which said spacer elements (4") are attached.

26. The connecting means according to claim 23, wherein said layer (16) is conducting at least in areas where said spacer elements (4") are attached.

27. The connecting means according to claim 23, wherein said spacer elements (4") are connected to each other through connection elements (17).

28. The connecting means according to claim 27, wherein said connection elements (17) are non-conducting.

29. The connecting means according to claim 27, wherein said connection elements (17) are conducting connecting elements (17) and are arranged such that they do not touch the upper layer of the circuit module.

30. A connecting means according to claim 29, wherein said conducting connecting elements (17) are either arranged centrally in the height direction of the spacer elements (4") or are aligned with the top surface of the spacer elements (4").

31. A device (DEV) comprising an electrical circuit module (MO) having a ground plane (2) and at least one electrical component (CO), said electrical component (CO) comprising:
a base (3); and
a ground plane (4) having a front surface and a back surface;
connecting means for connecting ground planes (2, 4) of the electrical circuit module (MO) and the electrical component (CO);
wherein said connecting means is provided between said ground plane (4) of said electrical component (CO) and said ground plane (2) of said electrical circuit module (MO), and said ground planes (2, 4) are electrically and mechanically connected only at specific locations of spacer elements (4").

32. The device according to claim 31, wherein at the spacer elements (4") are provided with a conductive adhesive or solder.

33. The device according to claim 31, wherein a layer (16) is provided on which said spacer elements (4") are attached.

34. The device according to claim 31, wherein said layer (16) is conducting at least in areas where said spacer elements (4") are attached.

35. The device according to claim 31, wherein said spacer elements (4") are connected to each other through connection elements (17).

36. The device according to claim 35, wherein said connection elements (17) are non-conducting.

37. The device according to claim 35, wherein said connection elements (17) are conducting connecting elements (17) and are arranged such that they do not touch the upper layer of the circuit module.

38. A device according to claim 37, wherein said conducting connecting elements (17) are either arranged centrally in the height direction of the spacer elements (4") or are aligned with the top surface of the spacer elements (4").

* * * * *